United States Patent
Shi et al.

(10) Patent No.: US 10,381,398 B2
(45) Date of Patent: Aug. 13, 2019

(54) METHOD FOR MANUFACTURING SEMICONDUCTOR APPARATUS

(71) Applicants: Semiconductor Manufacturing International (Shanghai) Corporation, Shanghai (CN); Semiconductor Manufacturing International (Beijing) Corporation, Beijing (CN)

(72) Inventors: Linbo Shi, Shanghai (CN); Fucheng Chen, Shanghai (CN)

(73) Assignees: SEMICONDUCTOR MANUFACTURING INTL. (SHANGHAI) Corp., Shanghai (CN); SEMICONDUCTOR MANUFACTURING INTL. (BEIJING) Corp., Beijing (CN)

( * ) Notice: Subject to any disclaimer, the term of this patent is extended or adjusted under 35 U.S.C. 154(b) by 0 days.

(21) Appl. No.: 16/050,580

(22) Filed: Jul. 31, 2018

(65) Prior Publication Data

US 2019/0074323 A1   Mar. 7, 2019

(30) Foreign Application Priority Data

Sep. 4, 2017   (CN) .......................... 2017 1 0785701

(51) Int. Cl.
*H01L 27/146*   (2006.01)
*H01L 21/00*   (2006.01)

(52) U.S. Cl.
CPC ........ *H01L 27/14685* (2013.01); *H01L 21/00* (2013.01); *H01L 27/1464* (2013.01); *H01L 27/14687* (2013.01)

(58) Field of Classification Search
CPC .................................................... H01L 27/146
See application file for complete search history.

(56) References Cited

U.S. PATENT DOCUMENTS

| 2012/0248940 | A1* | 10/2012 | Ariji | .................... | H03H 9/0595 |
| | | | | | 310/348 |
| 2015/0048509 | A1* | 2/2015 | Nagarajan | ............. | B81B 7/0006 |
| | | | | | 257/751 |

* cited by examiner

*Primary Examiner* — Marvin Payen
(74) *Attorney, Agent, or Firm* — Brinks Gilson & Lione

(57) ABSTRACT

The present disclosure relates to the field of semiconductor technologies, and discloses a method for manufacturing a semiconductor apparatus. The method includes: forming a water film on a bottom surface of a top wafer and a top surface of a bottom wafer; after the water film is formed, attaching the bottom surface of the top wafer to the top surface of the bottom wafer; disposing the attached top wafer and bottom wafer in a vacuum environment; and performing a thermal annealing process, so that the bottom surface of the top wafer is fusion-bonded to the top surface of the bottom wafer. The disclosed methods can reduce bubble voids existing between the bonded wafers.

11 Claims, 3 Drawing Sheets

METHOD FOR MANUFACTURING SEMICONDUCTOR APPARATUS

RELATED APPLICATIONS

The present application claims priority to Chinese Patent Appln. No. 201710785701.4, filed Sep. 4, 2017, the entire disclosure of which is hereby incorporated by reference.

BACKGROUND

Technical Field

The present disclosure relates to the field of semiconductor technologies, and in particular, to a method for manufacturing a semiconductor apparatus.

Related Art

In a manufacturing process of a semiconductor device such as a backside illumination (BSI) image sensor, a top wafer is fusion-bonded to a bottom wafer.

The inventor of this application finds that: After the top wafer is fusion-bonded to the bottom wafer, many bubble voids exist between edge areas of the upper wafer and the lower wafer, and a performance of the image sensor is affected.

SUMMARY

An objective of this application is to reduce bubble voids existing between edges of bonded wafers.

In one aspect of this disclosure, a method for manufacturing a semiconductor apparatus is provided. The method may include: forming a water film on a bottom surface of a top wafer and a top surface of a bottom wafer; after the water film is formed, attaching the bottom surface of the top wafer to the top surface of the bottom wafer; disposing the attached top wafer and bottom wafer in a vacuum environment; and performing a thermal annealing process, so that the bottom surface of the top wafer is fusion-bonded to the top surface of the bottom wafer.

In some implementations, pressure intensity in the vacuum environment is 0.0001 mBar to 0.1 mBar.

In some implementations, a duration period in the vacuum environment is 0.5 h to 2 h.

In some implementations, the method further includes: before the water film is formed, performing hydrophilic treatment on the bottom surface of the top wafer and the top surface of the bottom wafer.

In some implementations, the hydrophilic treatment includes plasma treatment.

In some implementations, treatment conditions of the plasma treatment include: vacuum pressure intensity being less than 1 mBar; a treatment time being 15 s to 90 s; power being 50 W to 200 W; and a treatment atmosphere including nitrogen.

In some implementations, forming a water film on a bottom surface of a top wafer and a top surface of a bottom wafer includes: cleaning a rotating bottom surface of the top wafer and a rotating top surface of the bottom wafer by using deionized water, so as to form the water film.

In some implementations, cleaning conditions of the cleaning step include: a cleaning time being 1 min to 5 min; and a rotational speed of the top wafer and the bottom wafer being 1000 revolutions per minute to 3000 revolutions per minute.

In some implementations, attaching the bottom surface of the top wafer to the top surface of the bottom wafer includes: applying a pressure of 1 N to 3 N onto a top surface of the top wafer, so that the bottom surface of the top wafer is attached to the top surface of the bottom wafer by means of attraction of an intermolecular force.

In some implementations, conditions of the thermal annealing process include: an annealing temperature being 300° C. to 500° C.; an annealing time being 1 h to 3 h; and an annealing atmosphere including nitrogen.

In some implementations, the semiconductor apparatus includes a BSI image sensor.

In some implementations, the attached top wafer and bottom wafer are disposed in the vacuum environment for a period of time and then the annealing process is performed, so that the bubble voids existing between the edges of the bonded top wafer and bottom wafer are reduced.

Exemplary embodiments and implementations of this application are described in detail with reference to the following accompanying drawings, to make other characteristics, aspects, and advantages of this application clear.

BRIEF DESCRIPTION OF THE DRAWINGS

The accompanying drawings constitute a part of this specification, describe exemplary embodiments and implementations of this disclosure, and are used to explain the principle of this disclosure together with the specification. In the accompanying drawings.

DETAILED DESCRIPTION

Now, various exemplary embodiments and implementations of this disclosure are described in detail with reference to the accompanying drawings. It should be understood that unless otherwise specifically stated, components, relative arrangement of steps, numeric expressions, and values described in the embodiments and implementations should not be understood as a limitation to the scope of this disclosure.

In addition, it should be understood that for ease of description, the size of each component shown in the accompanying drawings is not necessarily drawn according to an actual scaling relationship. For example, the thicknesses or the widths of some layers may be relatively enlarged compared with those of other layers.

The following description of the exemplary embodiments and implementations are merely descriptive, and is in no sense intended to limit this application and application or use thereof.

Technologies, methods, and apparatuses that are known to persons of ordinary skill in the related art may not be described in detail. When the technologies, methods, and apparatuses are applied, the technologies, methods, and apparatuses should be considered as a part of this specification.

It should be noted that similar numbers and letters represent similar items in the following accompanying drawings. Therefore, once an item is defined or described in an accompanying drawing, the item does not need to be further discussed in subsequent description of the accompanying drawings.

The inventor has performed in-depth research into the problem that bubble voids exist between bonded wafers, and finds that: Usually, fusion-bonding depends on an external force (for example, a needle) acting at the center of a top wafer, so that two to-be-bonded wafers are attached from centers to peripheries. However, in an attaching process, a fusion-bonding process is excessively fast and lacks directivity. Consequently, edge areas of the wafers are not fully fused, resulting in incomplete exhaustion of air, and the defect of an entire circle of bubble voids exists between the edge areas of the bonded wafers. On such basis, the inventor provides the following technical solutions.

Figure 1:
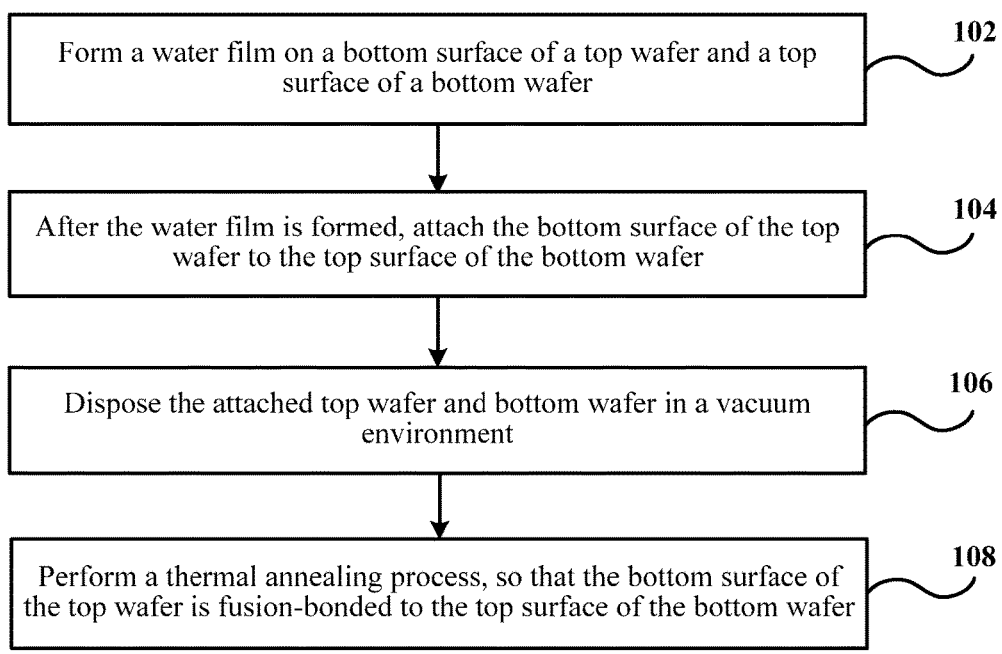
FIG. 1 is a flowchart of one example of a method for manufacturing a semiconductor apparatus.

FIG. 1 is a flowchart of a method for manufacturing a semiconductor apparatus.

In step 102, a water film is formed on a bottom surface of a top wafer and a top surface of a bottom wafer. The top wafer may be, for example, a carrier wafer, and the bottom wafer may be, for example, a device wafer.

In some implementations, a rotating bottom surface of the top wafer and a rotating top surface of the bottom wafer may be cleaned using deionized water, so as to form the water film. In some implementations, cleaning conditions of the cleaning step may include: a cleaning time being 1 min to 5 min, for example, 2 min, 3 min, or 4 min; and a rotational speed of the top wafer and the bottom wafer being 1000 revolutions per minute to 3000 revolutions per minute, for example, 1500 revolutions per minute, 2000 revolutions per minute, or 2500 revolutions per minute.

In step 104, after the water film is formed, the bottom surface of the top wafer is aligned with the top surface of the bottom wafer and then the bottom surface of the top wafer is attached to the top surface of the bottom wafer.

In some implementations, a pressure of 1 N to 3 N (for example, 2 N) may be applied onto a top surface of the top wafer at room temperature, so that the bottom surface of the top wafer is attached to the top surface of the bottom wafer by means of attraction of an intermolecular force.

In step 106, the attached top wafer and bottom wafer are disposed in a vacuum environment for a period of time, so that bubbles between an edge of the top wafer and an edge of the bottom wafer are released.

In some implementations, pressure intensity in the vacuum environment is 0.0001 mBar to 0.1 mBar, for example, 0.001 mBar or 0.01 mBar. In the foregoing pressure intensity range, bubbles between the edges of the wafers can be better released, so that bubble voids between the edges of the bonded wafers are further reduced. More preferably, a duration period in the vacuum environment whose pressure intensity is 0.0001 mBar to 0.1 mBar is 0.5 h to 2 h, for example, 1 h or 1.5 h.

In step 108, a thermal annealing process is performed, so that the bottom surface of the top wafer is fusion-bonded to the top surface of the bottom wafer.

In some implementations, the top wafer and the bottom wafer are silicon wafers, and bonding of a Si—O—Si atomic bond may be implemented by means of the thermal annealing process.

In some implementations, conditions of the thermal annealing process may include: an annealing temperature being 300° C. to 500° C., for example, 350° C., 400° C., or 450° C.; an annealing time being 1 h to 3 h, for example, 1.5 h, 2 h, or 2.5 h; and an annealing atmosphere including nitrogen and the like. The conditions of the thermal annealing process help further reduce the bubble voids between the edges of the bonded wafers.

In some implementations, the attached top wafer and bottom wafer are disposed in the vacuum environment for a period of time and then the annealing process is performed, so that the bubble voids existing between the edges of the bonded top wafer and bottom wafer are reduced.

Figure 2:
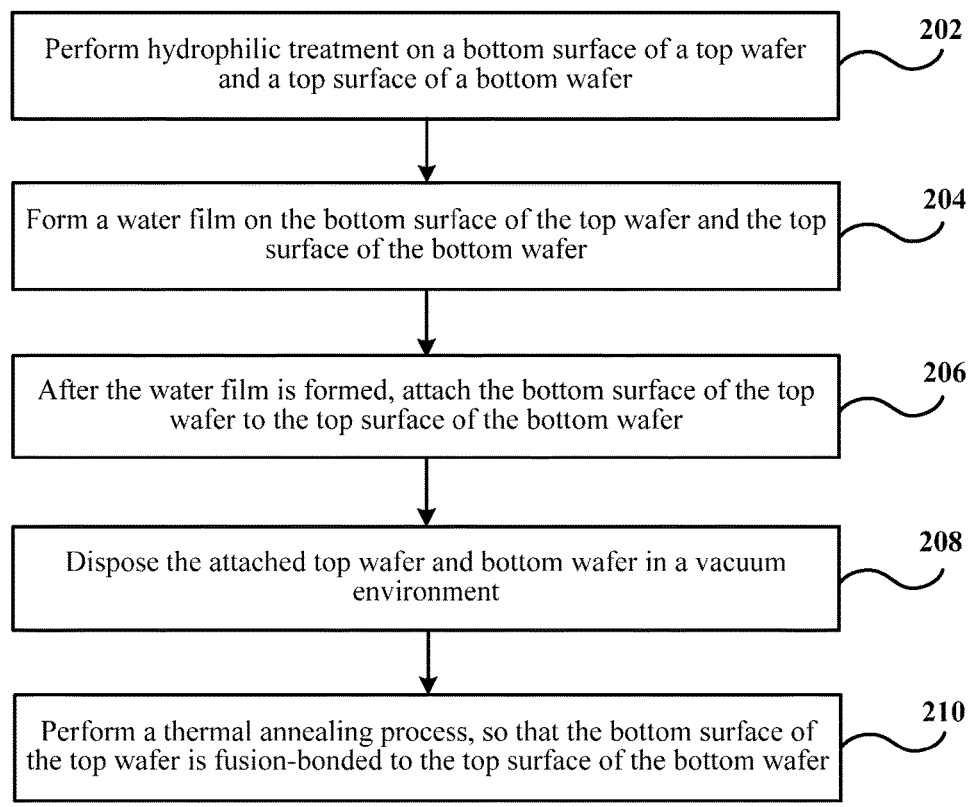
FIG. 2 is a flowchart of another example of a method for manufacturing a semiconductor apparatus.

FIG. 2 is a flowchart of another example of a method for manufacturing a semiconductor apparatus. The following description only describes differences between the example method shown in FIG. 2 and the example method shown in FIG. 1. For other related steps, refer to the foregoing description.

In step 202, hydrophilic treatment is performed on a bottom surface of a top wafer and a top surface of a bottom wafer.

In some implementations, the hydrophilic treatment may include plasma treatment. The plasma treatment may activate the bottom surface of the top wafer and the top surface of the bottom wafer, so that the bottom surface of the top wafer and the top surface of the bottom wafer have hydrophilicity. Treatment conditions of the plasma treatment preferably include the following conditions: vacuum pressure intensity being less than 1 mBar, for example, 0.5 mBar or 0.05 mBar; a treatment time being 15 s to 90 s, for example, 30 s, 60 s, or 80 s; power being 50 W to 200 W, for example, 80 W, 100 W, or 150 W; and a treatment atmosphere including nitrogen and the like.

In step 204, after the hydrophilic treatment, a water film is formed on the bottom surface of the top wafer and the top surface of the bottom wafer.

In step 206, after the water film is formed, the bottom surface of the top wafer is aligned with the top surface of the bottom wafer and then the bottom surface of the top wafer is attached to the top surface of the bottom wafer.

In step 208, the attached top wafer and bottom wafer are disposed in a vacuum environment for a period of time.

In step 210, a thermal annealing process is performed, so that the bottom surface of the top wafer is fusion-bonded to the top surface of the bottom wafer.

For step 204 to step 210, refer to description of step 102 to step 108, and details are not described herein again.

In this implementation, before the water film is formed, the hydrophilic treatment is performed on the bottom surface of the top wafer and the top surface of the bottom wafer. This helps improve a bonding effect.

Figure 3A:
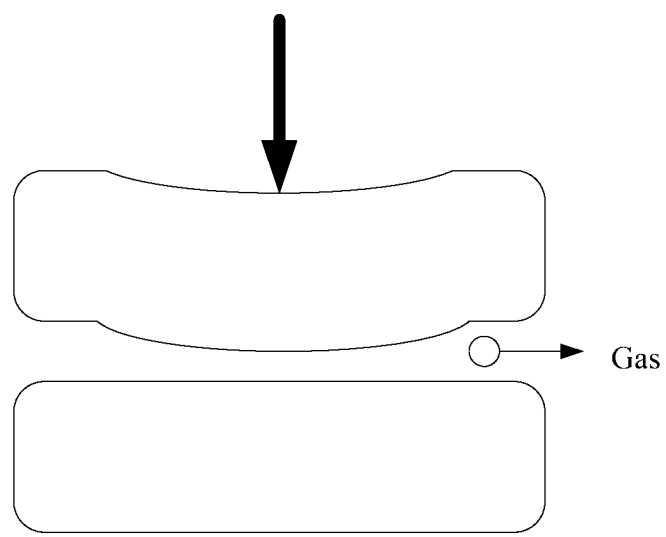
FIG. 3A is a schematic diagram of a top wafer and bottom wafer that are attached to each other.
Figure 3B:
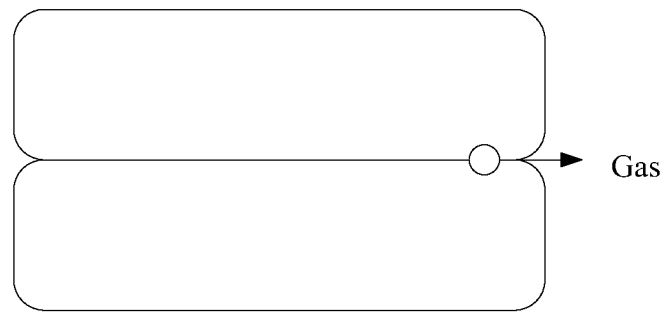
FIG. 3B is a schematic diagram of the attached top wafer and bottom wafer that are disposed in a vacuum environment.

FIG. 3A is a schematic diagram of a top wafer and bottom wafer that are attached to each other. FIG. 3B is a schematic diagram of the attached top wafer and bottom wafer that are disposed in a vacuum environment. It can be seen from FIG. 3A that when the top wafer is attached to the bottom wafer, gas on edge parts of the wafers cannot be completely exhausted. It can be seen from FIG. 3B that after the attached top wafer and bottom wafer are disposed in the vacuum environment for a period of time, the gas on the edge parts of the wafers can be well released, thereby reducing bubble voids between the edge parts of the wafers.

The methods provided in this disclosure are applicable to, but are not limited to, a BSI image sensor.

Above, methods for manufacturing a semiconductor are described in detail. To avoid obstructing the concepts of this disclosure, some details well known in the art are not described, and persons skilled in the art can fully understand, according to the foregoing description, how to implement the technical solutions disclosed herein. In addition, the embodiments and implementations taught by the disclosure of this specification may be freely combined. Persons skilled in the art should understand that multiple modifications may be made on the above-described embodiments and implementations without departing from the spirit and scope of this application as limited in the appended claims.

What is claimed is:

1. A method for manufacturing a semiconductor apparatus, comprising:
   forming a water film on a bottom surface of a top wafer and a top surface of a bottom wafer;
   after the water film is formed, attaching the bottom surface of the top wafer to the top surface of the bottom wafer;
   disposing the attached top wafer and bottom wafer in a vacuum environment; and
   performing a thermal annealing process, so that the bottom surface of the top wafer is fusion-bonded to the top surface of the bottom wafer.

2. The method according to claim 1, wherein pressure intensity in the vacuum environment is 0.0001 mBar to 0.1 mBar.

3. The method according to claim 2, wherein a duration period in the vacuum environment is 0.5 h to 2 h.

4. The method according to claim 1, further comprising:
   before the water film is formed, performing hydrophilic treatment on the bottom surface of the top wafer and the top surface of the bottom wafer.

5. The method according to claim 4, wherein the hydrophilic treatment comprises plasma treatment.

6. The method according to claim 5, wherein treatment conditions of the plasma treatment comprise:
   vacuum pressure intensity being less than 1 mBar;
   a treatment time being 15 s to 90 s;
   power being 50 W to 200 W; and
   a treatment atmosphere comprising nitrogen.

7. The method according to claim 1, wherein forming the water film on a bottom surface of a top wafer and a top surface of a bottom wafer comprises:
   cleaning a rotating bottom surface of the top wafer and a rotating top surface of the bottom wafer using deionized water, so as to form the water film.

8. The method according to claim 7, wherein cleaning conditions of the cleaning step comprise:
   a cleaning time being 1 min to 5 min; and
   a rotational speed of the top wafer and the bottom wafer being 1000 revolutions per minute to 3000 revolutions per minute.

9. The method according to claim 1, wherein attaching the bottom surface of the top wafer to the top surface of the bottom wafer comprises:
   applying a pressure of 1 N to 3 N onto a top surface of the top wafer, so that the bottom surface of the top wafer is attached to the top surface of the bottom wafer by means of attraction of an intermolecular force.

10. The method according to claim 1, wherein conditions of the thermal annealing process comprise:
    an annealing temperature being 300° C. to 500° C.;
    an annealing time being 1 h to 3 h; and
    an annealing atmosphere comprising nitrogen.

11. The method according to claim 1, wherein the semiconductor apparatus comprises a backside illumination image sensor.

* * * * *